United States Patent [19]

Scheibler

[11] Patent Number: 5,210,680
[45] Date of Patent: May 11, 1993

[54] CARD CAGE HAVING AN AIR COOLING SYSTEM

[75] Inventor: Edy Scheibler, Wetzikon, Switzerland

[73] Assignee: Sulzer Brothers Limited, Winterthur, Switzerland

[21] Appl. No.: 725,561

[22] Filed: Jul. 3, 1991

[30] Foreign Application Priority Data

Aug. 7, 1990 [CH] Switzerland ............ 02575/90

[51] Int. Cl.⁵ ............................................. H05K 7/20
[52] U.S. Cl. .................................. 361/384; 165/80.3; 361/415
[58] Field of Search ............... 312/350, 351, 223; 361/382, 383, 384, 386–388, 415; 174/16.1; 211/41; 165/80.3, 908, 104.34

[56] References Cited

U.S. PATENT DOCUMENTS

| 3,231,785 | 1/1966 | Calabro | 361/383 |
| 3,868,158 | 2/1975 | Laboue | 312/350 |
| 4,030,476 | 6/1977 | Hock | 126/246 |
| 4,277,815 | 7/1981 | Skroupa | 361/383 |
| 4,736,274 | 4/1988 | Davies | 261/399 |
| 4,851,965 | 7/1989 | Gabuzda | 361/383 |
| 4,862,320 | 8/1989 | Schmidt | 361/383 |
| 5,034,853 | 7/1991 | Mazura | 361/391 |

FOREIGN PATENT DOCUMENTS 2174193 10/1986 United Kingdom .

OTHER PUBLICATIONS

Product Engineering, vol. 34, No. 12, May 27, 1963 New York, New York, pp. 36–37, FIG. 6.

Primary Examiner—Gerald P. Tolin
Attorney, Agent, or Firm—Kenyon & Kenyon

[57] ABSTRACT

The card cage is provided with an air cooling system employing deformable baffles in the air flow path to the spaces between the printed circuit cards. The baffles are deformed upon assembly in order to adapt to the thermal conditions to be expected during operation of the card cage. The baffles provide minimum openings which produce a pressure in front of the openings which effects a more uniform flow distribution via the openings and which also permits an increase in the air flow rate to the printed circuit cards which are subject to strong thermal stresses.

4 Claims, 7 Drawing Sheets

CARD CAGE HAVING AN AIR COOLING SYSTEM

This invention relates to a card cage having an air cooling system. More particularly, this invention relates to a card cage having an air cooling system for printed circuit boards.

As is known, the efficiency of card cages or slide-in units for small computers and general control purposes, which are fitted with printed circuit cards having heat-developing electrical components, often varies greatly from card to card, due, in part, to the heat generated during use. Hence, the heat due to energy losses released per plug-in card at the electrical components has to be conveyed to the environment. In some instances, the temperature at the electrical components has been allowed to increase until temperature gradients to the environment are great enough to convey away the heat. However, the temperature at the electrical components may not exceed specified limit values as otherwise the components could become damaged.

In practice, various types of cooling arrangements have been provided to introduce cooling air having a determined inlet temperature over the cards such that, at an outlet of the printed circuit cards, the air is heated only by a permissible value DT. For example, in determined cases of application, a maximum increase in temperature of only $DT = 20°$ C. is permissible with an inlet temperature of $30°$ C.

A further requirement for an air cooling system for printed circuit cards is to have the smallest possible space requirement outside the mainly standardized card compartments. A large range of blowers and fans which can be positioned as a module with a small overall height under a card compartment are commercially available. Typical makes for axial fans are PAPST (Address: PAPST-MOTOREN GmbH, Postfach 1435, D-7742 St. Georgen/Schwarzwald), ETRI (address: ETRI, 8, Rue Boutard, F-92200 Neuilly-Sur-Seine), BOXER (address: IMC COMPONENTS, 55 Eddy Street, Providence R.I. 02903, USA). However, axial fans which are placed directly under a card compartment develop a cooling effect which varies from card to card because of the uneven flow in the spaces between the cards passing over them.

Accordingly, it is an object of the invention to equalize the varying thermal stresses and incident flows at a card compartment of a card cage to obtain an equalized temperature field in the exhaust air from the printed circuit boards.

It is another object of the invention to cool a card cage containing printed circuit boards in an efficient manner.

It is another object of the invention to provide a simplified air cooling system for cooling printed circuit cards in a card cage.

Briefly, the invention is directed to a card cage having a housing which defines a chamber for receiving a plurality of vertically disposed spaced apart parallel printed circuit cards having heat-developing electrical components and at least one fan for blowing air into the chamber to flow across the printed circuit cards. In accordance with the invention, a plurality of baffle plates are provided with each plate defining an air inlet having a minimum opening communicating with a space between a respective pair of printed circuit cards in the chamber. In addition, each baffle plate is adjustable in order to increase the opening to a multiple thereof.

The card cage is also provided with an outlet in the housing which communicates with the card compartment in order to exhaust air therefrom after passing over the printed circuit cards.

The construction of the card cage and the placement of the baffle plates is such that an air flow is guided from a fan inlet to the spaces between the printed circuit cards and on along the printed circuit cards to the outlet.

One advantage of the construction is that generally better use is made of the power provided for the circulation of air. In addition, a simple correction of the air flow can be made for cards subject to high thermal stresses at the time when the cards are assembled and when the thermal stresses acting on the cards are also known.

These and other objects and advantages of the invention will become more apparent from the following detailed description taken in conjunction with the accompanying drawings wherein:

Figure 1:
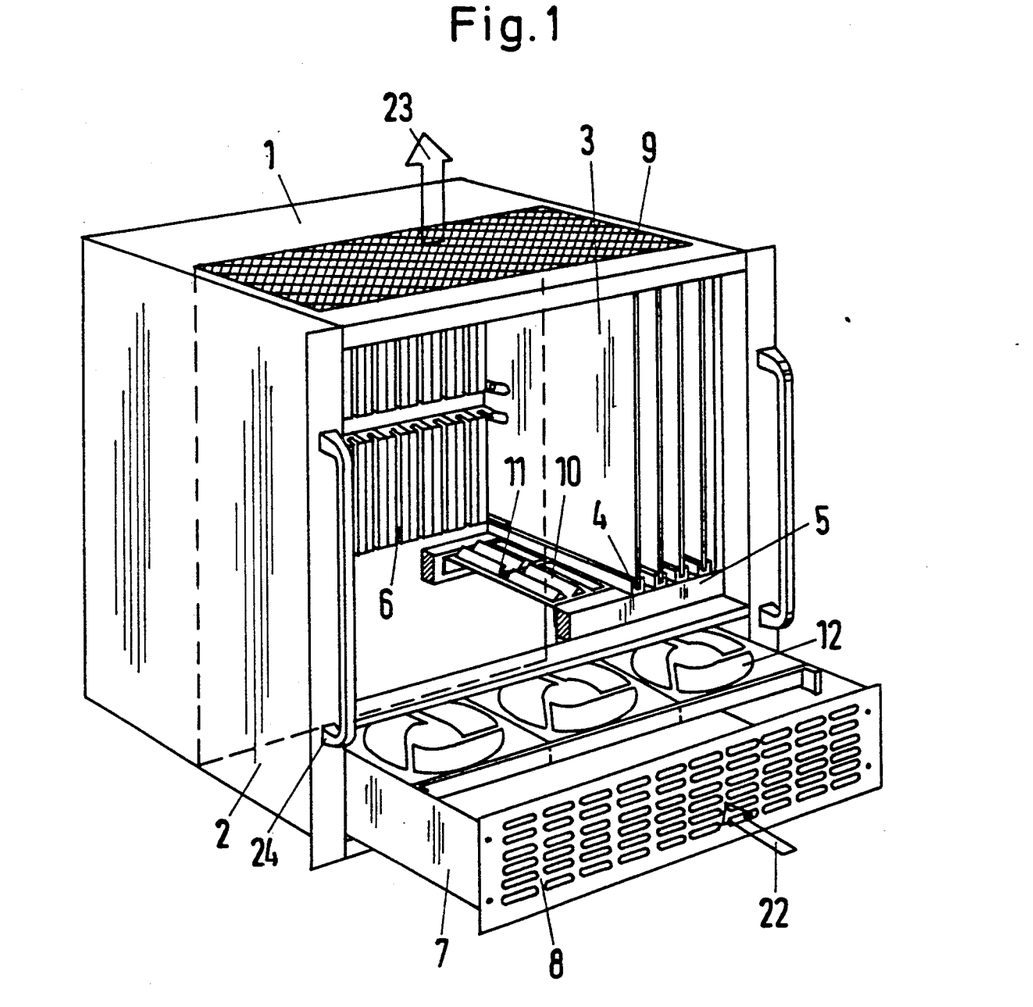
FIG. 1 illustrates a perspective lateral view of an open small computer with axial fans and a compartment for plug-in cards in accordance with the invention.

Referring to FIG. 1, the card cage 1 is of generally known construction and includes a housing 2 which defines a chamber for receiving a plurality of vertically disposed spaced apart parallel printed circuit cards 3 each of which has heatdeveloping electrical components thereon. As indicated, the cards 3 are guided at the top and at the bottom in guide rails or holders 4. In addition, the bottom holders 4 are mounted in perpendicular relation across a pair of supports 5. The cards also engage in edge board connectors 6 at the back edge.

The card cage 1 is also provided with a drawer 7 which is slidable into and out of the housing 2. This drawer 7 has an intake grating 8 at the front to provide an inlet for air and houses a plurality of fans, such as three axial fans for drawing air through the grating 8 in the direction indicated by the arrow 22.

The housing 2 also has an outlet 9 in the top thereof which communicates with the compartment containing the cards 3 in order to exhaust air therefrom in the direction indicated by the arrow 23 after passing over the printed circuit cards 3.

As indicated, handles 24 of conventional structure are secured to the housing 2.

Figure 2:
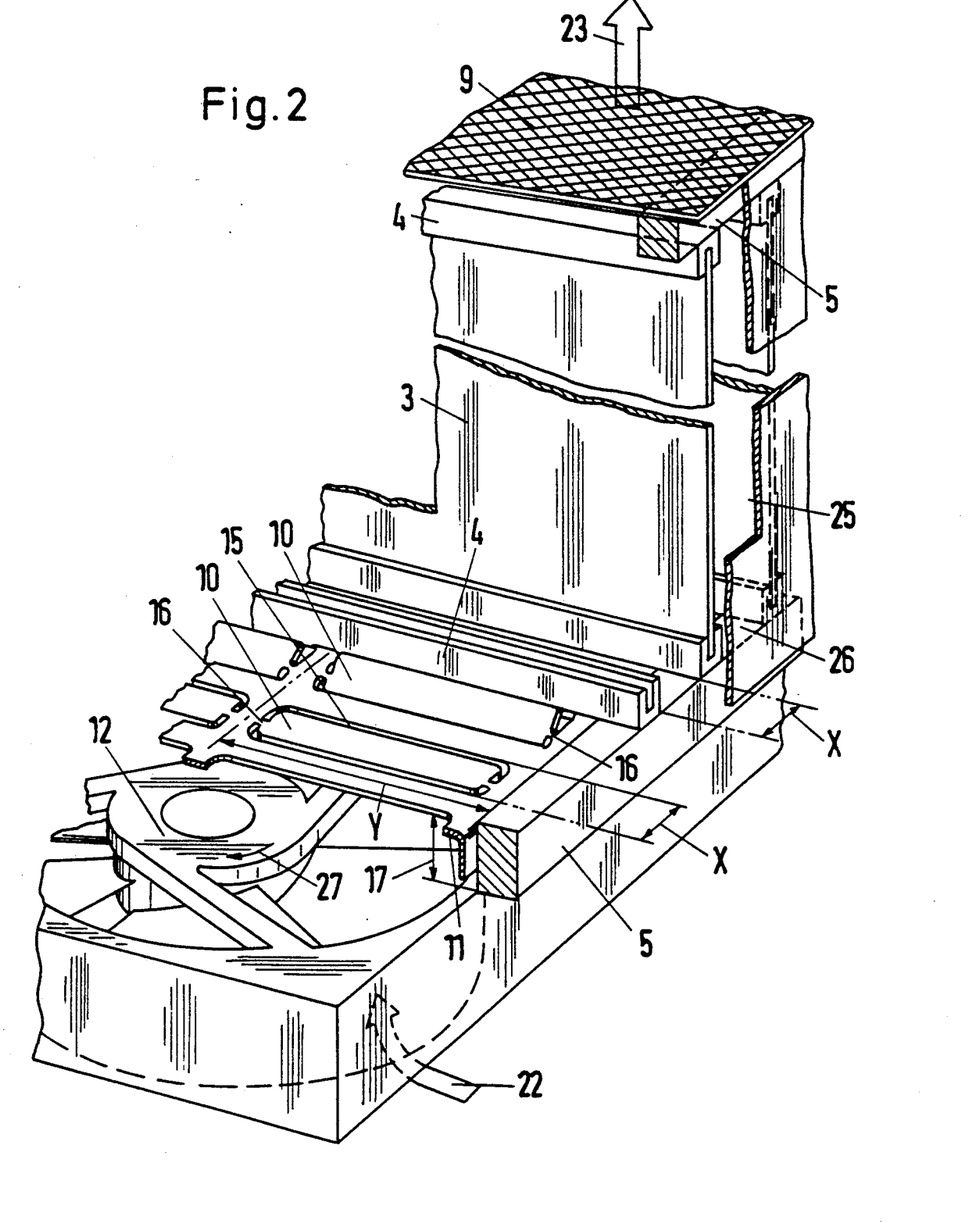
FIG. 2 illustrates an enlarged perspective detail from FIG. 1 with axial fans and plug-in cards.

Referring to FIG. 2, wherein like reference characters indicate like parts as above, the printed circuit cards 3 are spaced apart to define spaces or ducts 25 therebetween. In addition, a cover plate or plates 26 are mounted on the housing 2 in order to close the ducts 25.

As shown in FIG. 1, a horizontal floor plate 11 having a pair of vertical legs at the opposite ends is fitted between the supports 5 for the card holders 4. In addition, the plate 11 has a plurality of baffle plates 10 formed therein for controlling the amount of air flowing through the ducts 25 between the printed circuit cards 3. As indicated in FIG. 2, each baffle plate 10 is integrally formed in the floor plate 11 and is joined with the plate 11 by means of two plastically deformable joints 16 located at the respective ends of the baffle 10. As indicated, each baffle plate 10 defines a pair of slots 15 in the horizontal plate 11 which are disposed in parallel to the printed circuit cards 3. Each slot 15 is generally of U-shape with a rather long base and short legs. The cross-sectional area of the two slots 15 defined by a baffle plate 10 has a minimum of 10% of the cross-sectional area of a respective duct 25 between a pair of printed circuit cards 3.

As shown in FIG. 2, the floor plate 11 is spaced vertically by a distance indicated by the double arrow 17 from the base of the compartment to define a compensating section or plenum for equalizing the dynamic pressure under the baffle plates 10.

Figure 3:
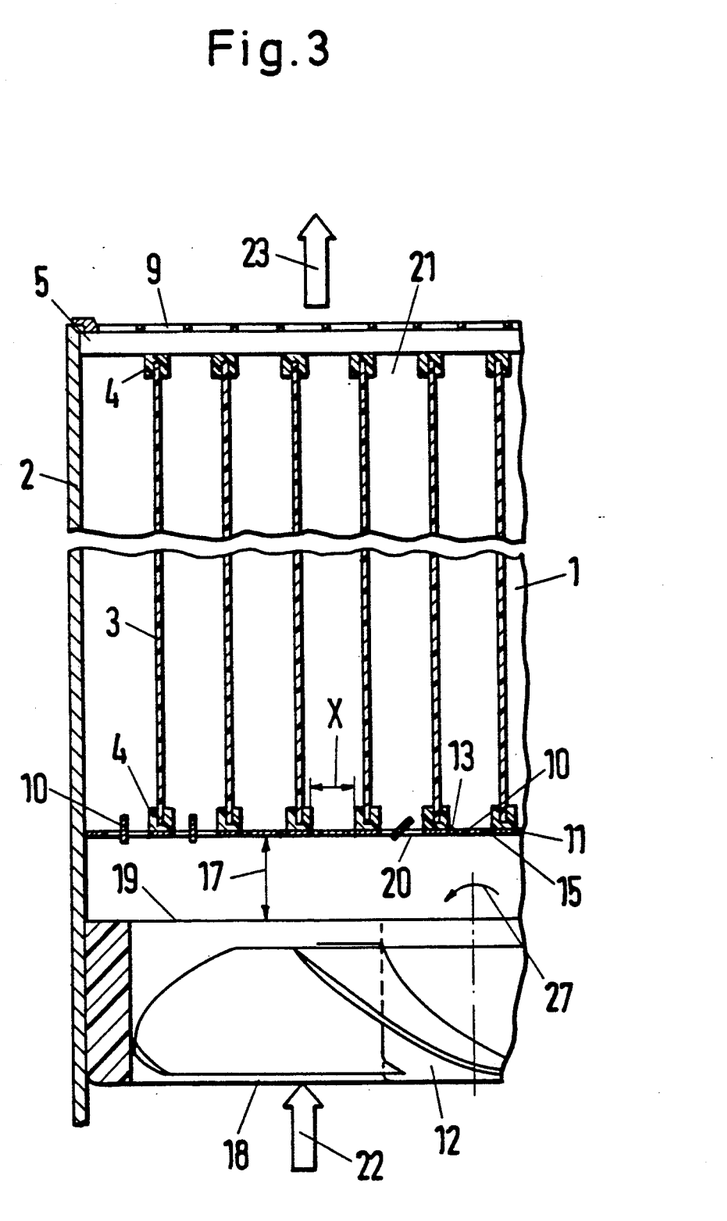
FIG. 3 illustrates a diagrammatic section through a part of the plug-in card compartment and the axial fans of the card cage of FIG. 1.

In use, each fan 12 rotates in a direction as indicated by the arrow 27 in FIG. 2 so as to draw air in the direction indicated by the arrow 22 through the grating 8 of the drawer 7 and thence upwardly into the plenum chamber between the fan 12 and the horizontal plate 11. The air then flows through the slots 15 defined by the baffle plates 10 upwardly between the pairs of respective cards 3 to subsequently exit through the outlet 9 in the direction indicated in the arrow 23. As indicated in FIG. 3, a stream of cooling air is guided from a fan inlet 18 through a fan outlet 19 and thence through each inlet 20 defined by a baffle plate 10 before flowing along the exposed surfaces of the cards 3 to an outlet 21 at the upper end of the cards 3 before passing through the outlet 9 of the housing 2.

As indicated in FIG. 2, each baffle plate 10 is adjustable so that the cross-section of the slot or opening 15 provided thereby can be adjusted to a multiple of the minimum opening cross-section.

Of note, the baffles 10 effect a minimum opening 13 which produces a pressure in front of the openings 13 which first effects a more uniform flow distribution via the openings 13. Secondly, by being deformable the baffles 10 enable an increase in the air flow rate through the baffles 10 for the cards 3 which are subject to high thermal stresses.

Compared with an embodiment without baffle plates 10, the additional loss in pressure at the baffle plates 10 reduces the air flow rate corresponding to the characteristic of the fan 12. Simultaneously, there occurs a better pressure distribution via all the baffle plates 10 which, in turn, results in uniform air distribution.

Referring to FIGS. 2 and 3, the cross-sectional area of the slots 15 is of a minimum of 10% of the cross-sectional area of a duct 25 between the respective pairs of cards 3. For example, as indicated in FIG. 2, for a spacing X between a pair of holders 4 for the cards 3 and a length Y corresponding to the area of influence of a baffle 10, the cross-sectional area of the two slots 15 defined by the baffle 10 amounts to roughly 10% of the area XY. Of note, optimal conditions are achieved with a card spacing of 0.8 inches.

For cards which are subject to higher thermal stresses in comparison with the majority of the cards 3, the baffles 10 are bent or deformed so as to increase the size of the openings defined by the slots 15. As a general rule, the cards 3 which are subject to high thermal stresses account for less than 30% of all the cards 3.

Figure 6A:
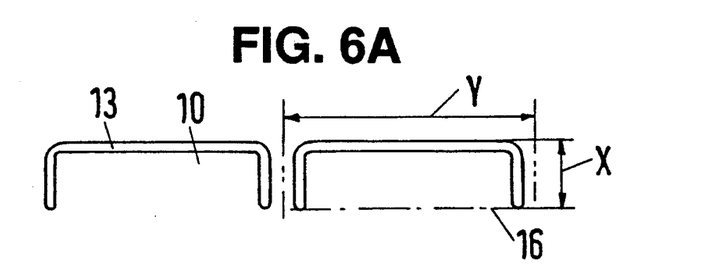
FIG. 6A illustrates an embodiment for minimum aperture of a baffle plate which can be extended by bending it out.
Figure 6B:
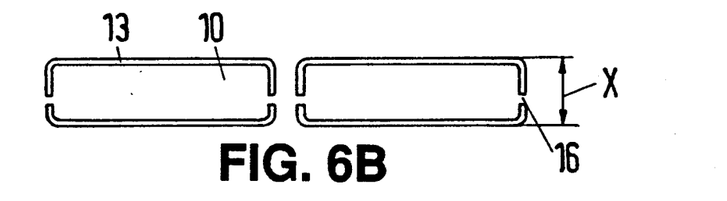
FIG. 6B illustrates a second embodiment for minimum aperture of a baffle plate which can be extended by bending it out.

Referring to FIG. 6, the baffle plates 10 may be formed so as to define various shaped slots. For example, FIG. 6a and 6b illustrate embodiments where the baffle plates 10 are formed by stamping out apertures 13 in a base plate. In each case, the apertures 13 have main portions which extend in parallel and adjacent to the lower card holders 4 (see FIG. 3). In the embodiment of FIG. 6b addition, each baffle 10 can be deformed towards the center of a duct 25 by bending out of the material of the baffle plate 10 so that the bent-out material of the baffle plate acts as a deflector. To determine the bending axis, plastically deformable joints 16 are provided.

Typically, the baffle plates 10 and the base plate 11 are made of sheet metal.

Figure 6C:
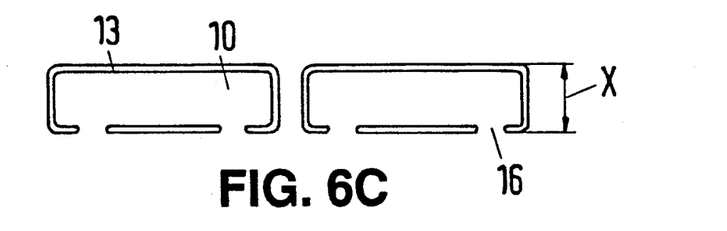
FIG. 6C illustrates a third embodiment for minimum aperture of a baffle plate which can be extended by bending it out.

As shown in FIG. 6c, each baffle plate 10 may be joined to the main plate by a pair of deformable joints 16.

For assembly purposes, it is only necessary to bend back the flanges of the baffle plate material with flat nose pliers by 90° for cards subject to higher thermal stresses and by 45° for cards subject to lower thermal stresses.

Figure 7A:
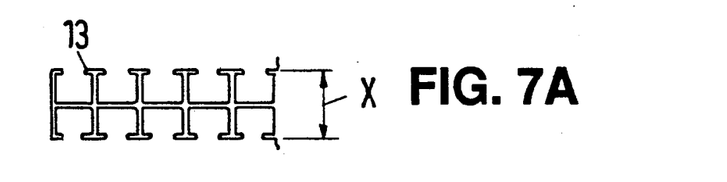
FIG. 7A illustrates an embodiment for minimum aperture of a baffle plate which can be extended by the removal of sections of the baffle plate provided for the purpose.
Figure 7B:
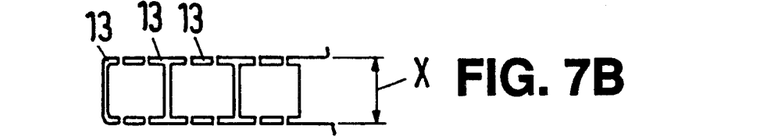
FIG. 7B illustrates a second embodiment for minimum aperture of a baffle plate which can be extended by the removal of sections of the baffle plate.
Figure 7C:
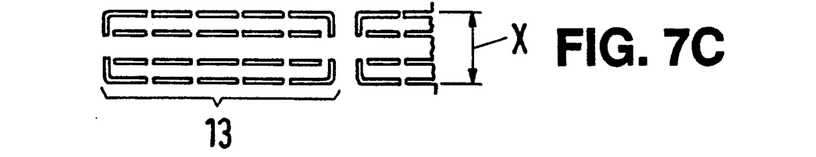
FIG. 7C illustrates a third embodiment for minimum aperture of a baffle which can be extended by the removal of sections of the baffle plate.

Referring to FIG. 7d, a plurality of baffle plates may be provided in a common array so as to define a multiplicity of openings 13. In this embodiment, the baffle plates may be made of a brittle material so that each individual baffle plate can be broken off and removed so as to define an enlarged opening rather than a slot. As indicated, each baffle plate is secured along a longitudinal edge to the main plate. Alternatively, as indicated in FIG. 7e, each baffle plate may be secured by two pairs of webs on opposite sides to the main plate. Still further, as shown in FIG. 7f, the baffle plates may be defined by a multiplicity of slots of discontinuous nature and by separating webs which can be selectively broken so as to provide for enlarged openings.

Figure 8:
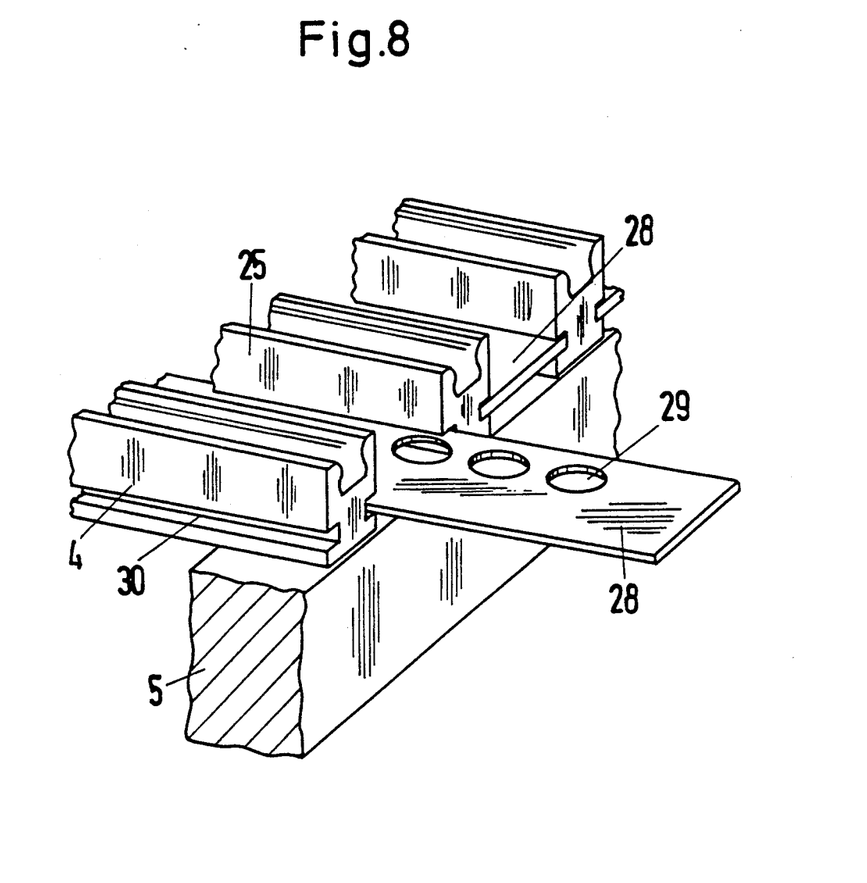
FIG. 8 illustrates baffle plates in the form of replaceable perforated strips.

Referring to FIG. 8, wherein like reference characters indicate like parts as above, each baffle plate 28 may be slidably mounted in and between a respective pair of holders 4. In this case, each baffle plate 28 may have a plurality of openings 29 of predetermined size therein with the openings 29 of the various plates 28 being adapted to the printed circuit cards to be cooled. As indicated, each holder 4 is provided with a pair of grooves for slidably guiding the respective baffle plates 28 therein.

Figure 4:
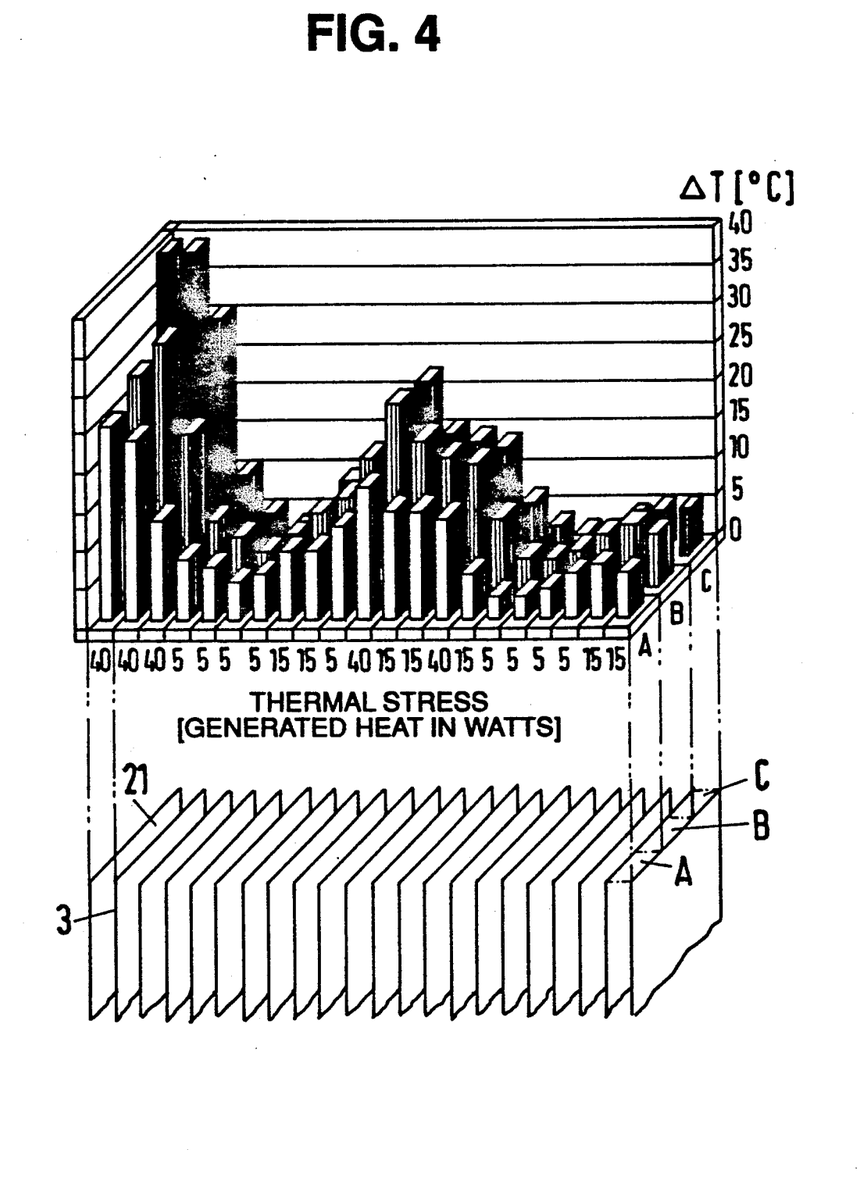
FIG. 4 illustrates the measured temperature field for the temperature increase DT at the outlet of a plug-in card compartment having no baffle plates for the purpose of flow distribution.
Figure 5:
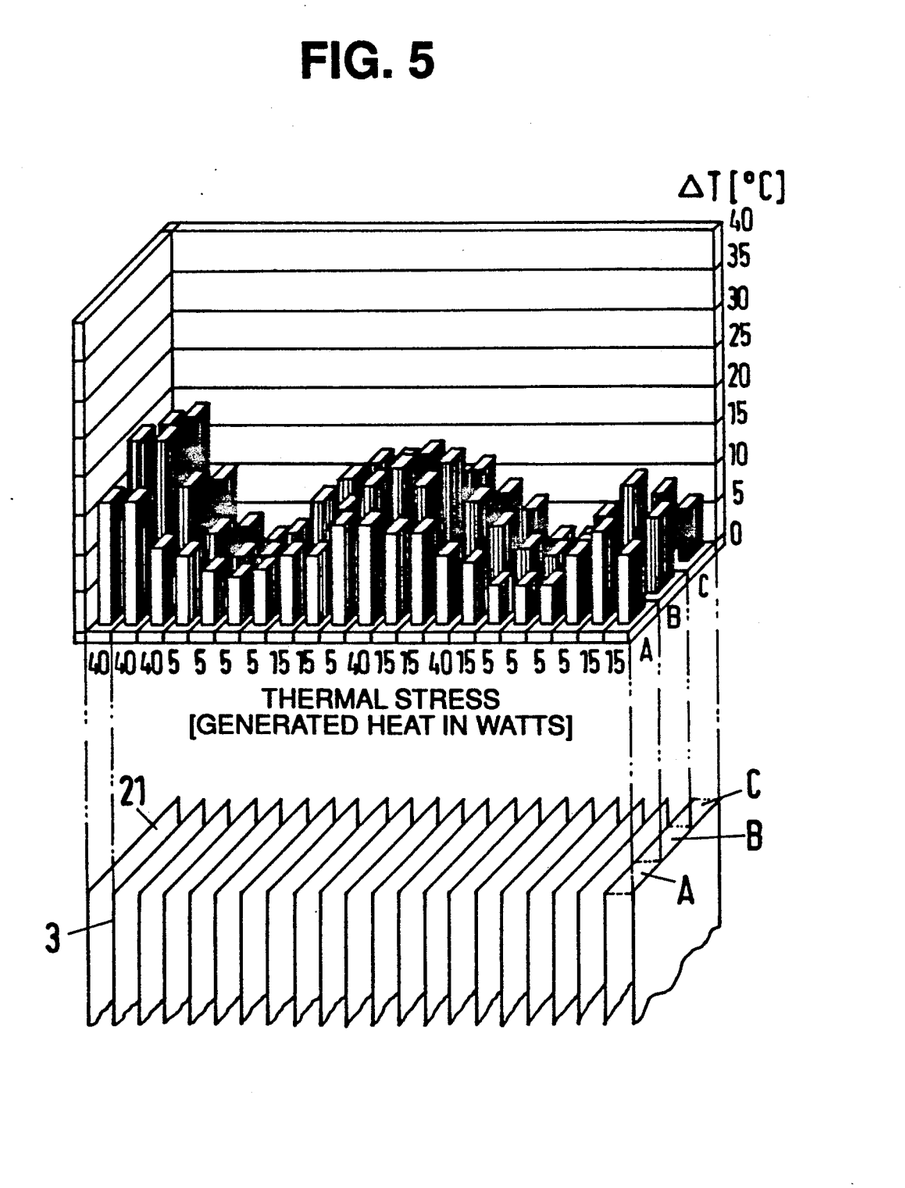
FIG. 5 illustrates the measured temperature field for the temperature increase DT at the outlet of a plug-in card compartment having baffle plates for the purpose of flow distribution.

The efficiency of the baffle plates 10 is shown by a comparison between FIG. 4 and FIG. 5. In the lower part, the figures show a compartment of printed circuit cards 3 with outlets 21 for the cooling air. For each outlet 21, the temperature increase $\Delta T$ was measured in the regions A, B and C between two adjacent printed circuit cards 3. In the upper part of FIGS. 4 and 5 there is shown the corresponding temperature field for the local temperature increases $\Delta T$. On the abscissa are given the thermal stresses simulated with ohmic resistances in Watts for the appropriate printed circuit card 3. The columns shown along the axis of ordinates give the measured temperature increase in °C., The effect of the baffle plates 10 is shown by a smoother section whereby maximum and minimum temperature increases become closer to a mean value.

Tho card cage is thus provided with an air cooling system in which a flow of air can be controlled in dependence upon the heat which is expected to be generated by the printed circuit cards mounted within the card cage. In this respect, the baffles which are provided in the flow path to the spaces between the printed circuit cards can be readily deformed or removed at the assembly of the printed circuit cards.

The invention thus provides for the equalization of varying thermal stresses and incident flows in the card compartment of a card cage such that an equalized temperature field is produced in the exhaust air from the printed circuit cards.

What is claimed is:

1. A card cage comprising
   a housing defining an upper compartment and a lower compartment which are separated by a sheet member, wherein the upper compartment defines a chamber receiving a plurality of vertically disposed spaced apart parallel printed circuit cards having heat-developing electrical components;
   a plurality of openings in said sheet member, each opening defining an air inlet having a minimum cross-sectional area and communicating with a space between a respective pair of printed circuit cards, wherein each inlet is located adjacent to a first end of each of said respective pair of printed circuit cards;
   a plurality of plate members, each plate member being disposed in a respective air-inlet to limit the cross-sectional area of the respective air-inlet, the position of each plate member being adjustable to vary the cross-sectional area of a respective air-inlet, and wherein each plate member is integrally formed from said sheet member;
   at least one fan for blowing air into the lower compartment and through each said air-inlet into said chamber to flow across the printed circuit cards such that the air passes from the first end of each printed circuit card received in said chamber to a second end of each printed circuit card, said second end being opposite said first end, said fan being in fluid communication with each said air-inlet; and
   an outlet in said housing communicating with said chamber to exhaust air therefrom after passing over the printed circuit cards, said outlet being located adjacent to the second end of the printed circuit cards.

2. A card cage as set forth in claim 1 wherein said minimum opening has a cross-sectional area equal to approximately 10% of the cross-sectional area of a respective space between a pair of printed circuit cards.

3. A card cage as set forth in claim 1 wherein each air-inlet is in the form of a slot extending in parallel to the printed circuit cards and wherein the position of each plate member may be adjusted to decrease the cross-sectional area of a respective air-inlet to said minimum cross-sectional area.

4. A card cage as set forth in claim 1, wherein each plate member comprises deformable joints securing it to said sheet member.

* * * * *

UNITED STATES PATENT AND TRADEMARK OFFICE
CERTIFICATE OF CORRECTION

PATENT NO. : 5,210,680

DATED : May 11, 1993

INVENTOR(S) : Scheibler

It is certified that error appears in the above-identified patent and that said Letters Patent is hereby corrected as shown below:

Column 2, line 64, change "heatdeveloping" to --heat developing--;
         line 68, after "cards" insert --3--.

Signed and Sealed this

Thirty-first Day of May, 1994

*Attest:*

BRUCE LEHMAN

*Attesting Officer*     Commissioner of Patents and Trademarks